(12) United States Patent
Lin et al.

(10) Patent No.: US 10,177,194 B2
(45) Date of Patent: Jan. 8, 2019

(54) FINGERPRINT IDENTIFICATION APPARATUS

(71) Applicant: Gingy Technology Inc., Hsinchu (TW)

(72) Inventors: Patrick Lin, Hsinchu (TW); Jen-Chieh Wu, Hsinchu (TW)

(73) Assignee: Gingy Technology Inc., Hsinchu (TW)

( * ) Notice: Subject to any disclaimer, the term of this patent is extended or adjusted under 35 U.S.C. 154(b) by 0 days.

(21) Appl. No.: 16/008,049

(22) Filed: Jun. 14, 2018

(65) Prior Publication Data

US 2018/0358401 A1 Dec. 13, 2018

Related U.S. Application Data

(63) Continuation-in-part of application No. 15/239,842, filed on Aug. 18, 2016, now Pat. No. 10,049,256.

(60) Provisional application No. 62/266,002, filed on Dec. 11, 2015, provisional application No. 62/620,985, filed on Jan. 23, 2018.

(30) Foreign Application Priority Data

Jul. 18, 2016 (TW) .............................. 105122567 A
Apr. 24, 2018 (CN) ...................... 2018 2 0585500 U (51) Int. Cl.
| | | |
|---|---|---|
| *H01L 27/146* | (2006.01) | |
| *G06K 9/00* | (2006.01) | |
| *F21V 8/00* | (2006.01) | |

(52) U.S. Cl.
CPC .... *H01L 27/14678* (2013.01); *G06K 9/00087* (2013.01); *H01L 27/14625* (2013.01); *H01L 27/14629* (2013.01); *G02B 6/0011* (2013.01)

(58) Field of Classification Search
CPC .... G02B 27/30; G02B 6/0011; G06K 9/0004; G06K 9/00053; G06K 2009/0006; G06K 9/00087; G09G 3/3225; H01L 27/3234; H01L 27/14625; H01L 27/14629; H01L 27/14678
See application file for complete search history.

(56) References Cited

U.S. PATENT DOCUMENTS

| | | |
|---|---|---|
| 5,177,802 A | 1/1993 | Fujimoto et al. |
| 8,391,569 B2 | 3/2013 | Wu |
| 2012/0321149 A1 | 12/2012 | Carver et al. |
| 2013/0050123 A1 | 2/2013 | Lien et al. |
| 2013/0120760 A1 | 5/2013 | Raguin et al. |

(Continued)

FOREIGN PATENT DOCUMENTS

| | | |
|---|---|---|
| CN | 103019474 | 4/2013 |
| JP | 2003141514 | 5/2003 |

(Continued)

*Primary Examiner* — Michael Pervan
(74) *Attorney, Agent, or Firm* — JCIPRNET (57) ABSTRACT

A fingerprint identification apparatus including a display device, a first translucent base, photosensitive structures, a first light-guide structure, and a light source is provided. The display device has pixel regions and transmissive regions located between the pixel regions. The first translucent base has photosensitive regions and light-emitting regions located between the photosensitive regions. The photosensitive structures are respectively disposed in the photosensitive regions of the first translucent base. The first translucent base is disposed between the photosensitive structures and the first light-guide structure. The light source is disposed adjacent to the first translucent base.

17 Claims, 8 Drawing Sheets

(56) References Cited

U.S. PATENT DOCUMENTS

2014/0205160 A1    7/2014   Chang et al.
2016/0132712 A1    5/2016   Yang et al.
2016/0224816 A1    8/2016   Smith et al.
2017/0212358 A1    7/2017   Fan et al.

FOREIGN PATENT DOCUMENTS

FINGERPRINT IDENTIFICATION APPARATUS

CROSS-REFERENCE TO RELATED APPLICATION

This application is a continuation-in-part application of and claims the priority benefit of U.S. application Ser. No. 15/239,842, filed on Aug. 18, 2016, now pending, which claims the priority benefits of U.S. provisional application Ser. No. 62/266,002, filed on Dec. 11, 2015, and Taiwan application serial no. 105122567, filed on Jul. 18, 2016. This application also claims the priority benefits of U.S. provisional application Ser. No. 62/620,985, filed on Jan. 23, 2018, and China application serial no. 201820585500.X, filed on Apr. 24, 2018. The entirety of each of the above-mentioned patent applications is hereby incorporated by reference herein and made a part of this specification.

BACKGROUND OF THE INVENTION

Field of the Invention

The invention relates to an electronic apparatus, and more particularly, to a fingerprint identification apparatus.

Description of Related Art

A fingerprint identification apparatus is often provided in an electronic product having a display device (such as a smart phone or a tablet computer). In general, the fingerprint identification apparatus can be divided into built-in and non-built-in. A built-in fingerprint identification apparatus is integrated in the display device, but the disposition of the fingerprint identification apparatus complicates the layout of the display device and reduces the resolution of the display device. A non-built-in fingerprint identification apparatus is disposed below the display device, but the sensing area of the non-built-in fingerprint identification apparatus is small. Moreover, both the built-in and non-built-in fingerprint identification apparatuses irradiate a fingerprint using a display light beam emitted by the display device (such as an organic light-emitting diode display panel) to complete fingerprint identification, and therefore fingerprint identification needs to be performed when the display device has a non-black screen.

SUMMARY OF THE INVENTION

The invention provides a fingerprint identification apparatus having good performance.

A fingerprint identification apparatus of the invention is configured to sense a fingerprint. The fingerprint identification apparatus includes a display device, a first translucent base, a plurality of photosensitive structures, a first light-guide structure, and a light source. The display device has a plurality of pixel regions and a plurality of transmissive regions located between the plurality of pixel regions. The first translucent base has a plurality of photosensitive regions and a plurality of light-emitting regions located between the plurality of photosensitive regions. The plurality of photosensitive structures is respectively disposed in the plurality of photosensitive regions of the first translucent base. The first translucent base is disposed between the plurality of photosensitive structures and the first light-guide structure. The light source is disposed adjacent to the first translucent base and configured to emit a light beam. The light beam is, in order, guided by the first light-guide structure to be transmitted from a light-emitting region of the first translucent base toward the display device, passes through one transmissive region of the display device, is diffused by the fingerprint, and passes through another transmissive region of the display device to be transmitted to a photosensitive structure.

In an embodiment of the invention, the display device has a display surface, each of the light-emitting regions of the first translucent base and a corresponding transmissive region of the display device are arranged along a first oblique direction, an angle $\alpha 1$ is between the first oblique direction and a normal direction of the display surface, and $0°<\alpha 1<90°$.

In an embodiment of the invention, the display device has a display surface, each of the transmissive regions of the display device and a corresponding photosensitive structure are arranged along a second oblique direction, an angle $\beta 1$ is between the second oblique direction and a normal direction of the display surface, and $0°<\beta 1<90°$.

In an embodiment of the invention, the display device has a display surface, and each of the light-emitting regions of the first translucent base and a corresponding transmissive region of the display device are arranged along the first oblique direction. Each of the transmissive regions of the display device and a corresponding photosensitive structure are arranged along the second oblique direction, and the first oblique direction is intersected with the second oblique direction.

In an embodiment of the invention, the fingerprint identification apparatus further includes a collimating device. The collimating device is disposed between the display device and the photosensitive structures. The collimating device has a plurality of first optical channels extended along a third oblique direction and a plurality of second optical channels extended along a fourth oblique direction. The third oblique direction is intersected with the fourth oblique direction. One light-emitting region of the first translucent base and one transmissive region of the display device corresponding to each other are respectively disposed adjacent to two ends of each of the first optical channels. One transmissive region of the display device and one photosensitive structure corresponding to each other are respectively disposed adjacent to two ends of each of the second optical channels.

In an embodiment of the invention, the first translucent base has a first surface and a second surface opposite to each other, the plurality of photosensitive structures is disposed on the first surface of the first translucent base, and the first light-guide structure is disposed on the second surface of the first translucent base.

In an embodiment of the invention, the fingerprint identification apparatus further includes a reflective layer. The first light-guide structure is disposed between the plurality of photosensitive structures and the reflective layer.

In an embodiment of the invention, the fingerprint identification apparatus further includes a second translucent base. The second translucent base has a first surface, a second surface opposite to the first surface, and a side surface connected between the first surface and the second surface. The light beam enters the second translucent base from the side surface of the second translucent base in order, and the first translucent base is disposed on the first surface of the second translucent base.

In an embodiment of the invention, the fingerprint identification apparatus further includes a first adhesive layer connected between the first translucent base and the first surface of the second translucent base.

In an embodiment of the invention, the first light-guide structure is disposed on the second surface of the second translucent base.

In an embodiment of the invention, the fingerprint identification apparatus further includes a reflective layer, wherein the first light-guide structure is disposed between the second surface of the second translucent base and the reflective layer.

In an embodiment of the invention, the first light-guide structure is disposed on the first surface of the second translucent base.

In an embodiment of the invention, the fingerprint identification apparatus further includes a reflective layer disposed on the second surface of the second translucent base.

In an embodiment of the invention, the fingerprint identification apparatus further includes a second light-guide structure, wherein the first light-guide structure and the second light-guide structure are disposed on the first surface of the second translucent base and the second surface of the second translucent base.

In an embodiment of the invention, the fingerprint identification apparatus further includes a reflective layer disposed on the second surface of the second translucent base, wherein the second light-guide structure is disposed between the second translucent base and the reflective layer.

In an embodiment of the invention, the fingerprint identification apparatus further includes a second adhesive layer connected between the display device and the first translucent base.

In an embodiment of the invention, an angle γ is between a transmission direction of the light beam guided by the first light-guide structure and not passing through the display device and a normal direction of the display surface, and 30°≤γ≤85°.

Based on the above, in an embodiment of the invention, the separately manufactured photosensitive structures are disposed below the display device, and therefore a fingerprint identification apparatus having a full-sensing area can be implemented under the premise of not affecting the resolution of the display device. Moreover, the plurality of photosensitive structures and the first translucent base can be regarded as one photoelectronic sensor, the light beam irradiating the fingerprint is provided by a light source disposed adjacent to the photoelectronic sensor, and the light beam emitted by the light source is transmitted using the first translucent base of the photoelectronic sensor. Therefore, the fingerprint identification apparatus can perform fingerprint identification when the display device displays a black screen (i.e., no display).

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Hereinafter, exemplary embodiments of the invention are described in detail, and examples of the exemplary embodiments are conveyed via the figures. Wherever possible, the same reference numerals are used in the drawings and the descriptions to refer to the same or similar portions.

Figure 1:
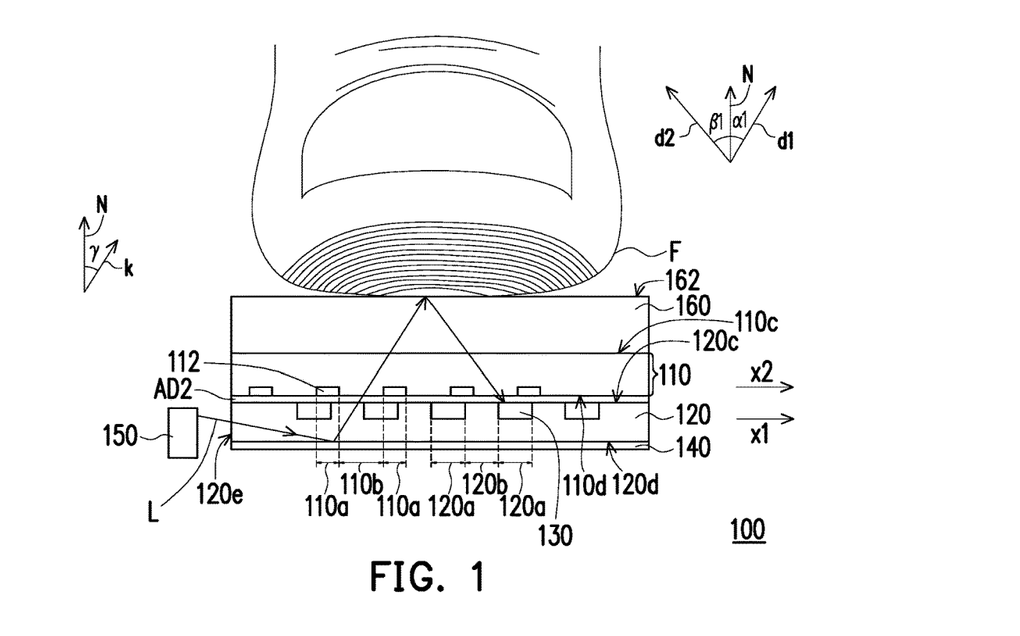
FIG. 1 is a cross section of a fingerprint identification apparatus of the first embodiment of the invention.

FIG. 1 is a cross section of a fingerprint identification apparatus of the first embodiment of the invention. Referring to FIG. 1, a fingerprint identification apparatus 100 is configured to sense a fingerprint F. The fingerprint identification apparatus 100 includes a display device 110, a first translucent base 120, a plurality of photosensitive structures 130, a first light-guide structure 140, and a light source 150. The display device 110 has a plurality of pixel regions 110a and a plurality of transmissive regions 110b located between the plurality of pixel regions 110a. In the present embodiment, the display device 110 includes a plurality of pixels 112, each of the pixels 112 includes a thin-film transistor (not shown) and a pixel electrode (not shown) electrically connected to the thin-film transistor, and the regions occupied by the plurality of pixels 112 are the plurality of pixel regions 110a of the display device 110. The display device 110 further includes a driver circuit (such as a data line or scan line; not shown) electrically connected to the thin-film transistor. At least a portion of the driver circuit is not translucent, and the regions between the at least one portion of the driver circuit that is not translucent and the plurality of pixels 112 can be the plurality of transmissive regions 110b. For instance, in the present embodiment, the display device 110 can be an organic light-emitting diode (OLED) display panel, but the invention is not limited thereto.

The first translucent base 120 has a plurality of photosensitive regions 120a and a plurality of light-emitting regions 120b. The plurality of photosensitive structures 130 is respectively disposed in the plurality of photosensitive regions 120a of the first translucent base 120. The plurality of light-emitting regions 120b is located between the plurality of photosensitive regions 120a. In the present embodiment, the plurality of photosensitive structures 130 can be formed on the first translucent base 120, and the plurality of photosensitive structures 130 and the first translucent base 120 can be regarded as one photoelectronic sensor. For instance, in the present embodiment, the material of the first translucent base 120 is glass, and the plurality of photosensitive structures 130 and the first translucent base 120 can be regarded as one glass-based sensor. However, the invention is not limited thereto, and in other embodiments, the material of the first translucent base 120 can also be other types of translucent materials such as polyethylene terephthalate (PET) or polycarbonate (PC). Moreover, in the present embodiment, the plurality of photosensitive structures 130 can optionally be embedded in the first translucent base 120. However, the invention is not limited thereto, and in other embodiments, the plurality of photosensitive structures 130 can also be slightly protruded beyond the first translucent base 120.

The display device 110 has a display surface 110c, and the display surface 110c has a normal direction N. In the present embodiment, each of the light-emitting regions 120b of the first translucent base 120 and one corresponding transmissive region 110b of the display device 110 can be arranged along a first oblique direction d1. In other words, the plurality of photosensitive structures 130 is arranged along a direction x1, and one light-emitting region 120b between two adjacent photosensitive structures 130 has a first width center along the direction x1. The plurality of pixels 112 is arranged along a direction x2 parallel to the direction x1, one transmissive region 110b between two adjacent pixels 112 respectively located above the two adjacent photosensitive structures 130 has a second width center along the direction x2, and a reference line (not shown) passing through the first width center and the second width center is intersected with a normal (not shown) of the display surface 110c.

In the present embodiment, each of the transmissive regions 110b of the display device 110 and one corresponding photosensitive structure 130 are arranged along a second oblique direction d2, and the second oblique direction d2 is intersected with the first oblique direction d1 and the normal direction N. In other words, the plurality of photosensitive structures 130 is arranged along the direction x1, one light-emitting region 120b between two adjacent photosensitive structures 130 has a first width center along the direction x1, one photosensitive structure 130 located below the light-emitting region 120b has a third width center along the direction x1, and a reference line (not shown) passing through the first width center and the third width center is intersected with a normal (not shown) of the display surface 110c. In the present embodiment, an angle α1 is between the first oblique direction d1 and the normal direction N of the display surface 110c, and 0°<α1<90°. An angle β1 is between the second oblique direction d2 and the normal direction N of the display surface 110c, and 0°<β1<90°. The angle α1 and the angle β1 can be the same or different.

The first translucent base 120 is disposed between the plurality of photosensitive structures 130 and the first light-guide structure 140. The first light-guide structure 140 is configured to guide a light beam L to be dispersed throughout the fingerprint F. For instance, an angle γ is between a transmission direction k of the light beam L guided by the first light-guide structure 140 and not passing through the display device 110 and the normal direction N of the display surface 110c of the display device 110, and 30°≤γ≤85°, but the invention is not limited thereto. In the present embodiment, the first light-guide structure 140 can be a plurality of optical microstructures (such as a plurality of micro prism columns), but the invention is not limited thereto, and in other embodiments, the first light-guide structure 140 can also be a grating or other suitable type of light-guide structures.

The first translucent base 120 has a first surface 120c, a second surface 120d opposite to the first surface 120c, and a side surface 120e connected between the first surface 120c and the second surface 120d. The plurality of photosensitive structures 130 is disposed on the first surface 120c of the first translucent base 120. In the present embodiment, the first light-guide structure 140 can be optionally disposed on the second surface 120d of the first translucent base 120. However, the invention is not limited thereto, and in other embodiments, the first light-guide structure 140 can also be disposed in other suitable locations. Descriptions are provided with reference to other figures in the following paragraphs.

In the present embodiment, the fingerprint identification apparatus 100 further includes a second adhesive layer AD2. The second adhesive layer AD2 is connected between the display device and the first translucent base 120. The photoelectronic sensor formed by the plurality of photosensitive structures 130 and the first translucent base 120 is adhered to a back surface 110d of the display device 110 via the second adhesive layer AD2. For instance, the second adhesive layer AD2 can be an optically-clear adhesive (OCA), but the invention is not limited thereto.

In the present embodiment, the fingerprint identification apparatus 100 can further include a cover plate 160. The cover plate 160 is disposed on the display surface 110c of the display device 110. The cover plate 160 is configured to protect components (such as the display device 110 and the photosensitive structures 130) below and provide one pressing surface 162. The pressing surface 162 is configured to be pressed by the fingerprint F of a finger of a user. The selection of the material of the cover plate 160 preferably has high transmittance and sufficient rigidity. For instance, in the present embodiment, the material of the cover plate 160 can be glass, but the invention is not limited thereto.

The light source 150 is disposed adjacent to the first translucent base 120 and configured to emit the light beam L. In the present embodiment, the light beam L enters the first translucent base 120 from the side surface 120e of the first translucent base 120 to be transmitted to the first light-guide structure 140. The light beam L transmitted to the first light-guide structure 140 is guided by the first light-guide structure 140 to be transmitted from the light-emitting region 120b of the first translucent base 120 toward the transmissive region 110b of the display device 110. Next, the light beam L passes through the transmissive region 110b of the display device 110, passes through the cover plate 160, is diffused by the fingerprint F, and passes through another transmissive region 110b of the display device 110 to be transmitted to the photosensitive structures 130. Accordingly, the photosensitive structures 130 can obtain an image of the fingerprint F for fingerprint identification. In the present embodiment, the light source 150 can be a light-emitting diode (LED) or other suitable light sources. The light beam L emitted by the light source 150 is, for instance, visible light, infrared light, a light beam having other suitable wavelength ranges, or a combination of at least two of the above.

In the present embodiment, the photosensitive structures 130 and the display device 110 are separately manufactured.

That is, the photosensitive structures 130 are not built in the display device 110. The separately manufactured photosensitive structures 130 are disposed below the display device 110, and a fingerprint identification apparatus 100 having a full-sensing area can be implemented under the premise of not affecting the resolution of the display device 110. Moreover, in the present embodiment, the light source 150 configured to provide the light beam L diffused in the fingerprint F is electrically independent from the display device 110. Therefore, when the display device 110 displays a black screen (i.e., no display), the fingerprint identification apparatus 100 can still perform fingerprint identification.

Moreover, in the present embodiment, the first light-guide structure 140 can guide the light beam L to pass through the light-emitting region 120b and the transmissive region 110b arranged along the first oblique direction d1 such that the light beam L is irradiated throughout the fingerprint F. Accordingly, the area in which the light beam L irradiates the fingerprint F can be increased. The light beam L is substantially transmitted along a direction intersected with the normal direction N (such as an opposite direction to the second oblique direction d2) after being diffused by the fingerprint F. In the present embodiment, since the transmissive region 110b of the display device 110 and the photosensitive structures 130 are arranged along the second oblique direction d2 intersected with the normal direction N, most of the light beam L diffused by the fingerprint F can pass through the transmissive region 110b to be received by the photosensitive structures 130. Accordingly, the intensity of the light beam L received by the photosensitive structures 130 is increased, such that the image-capture quality of the fingerprint identification apparatus 100 can be increased.

Figure 2:
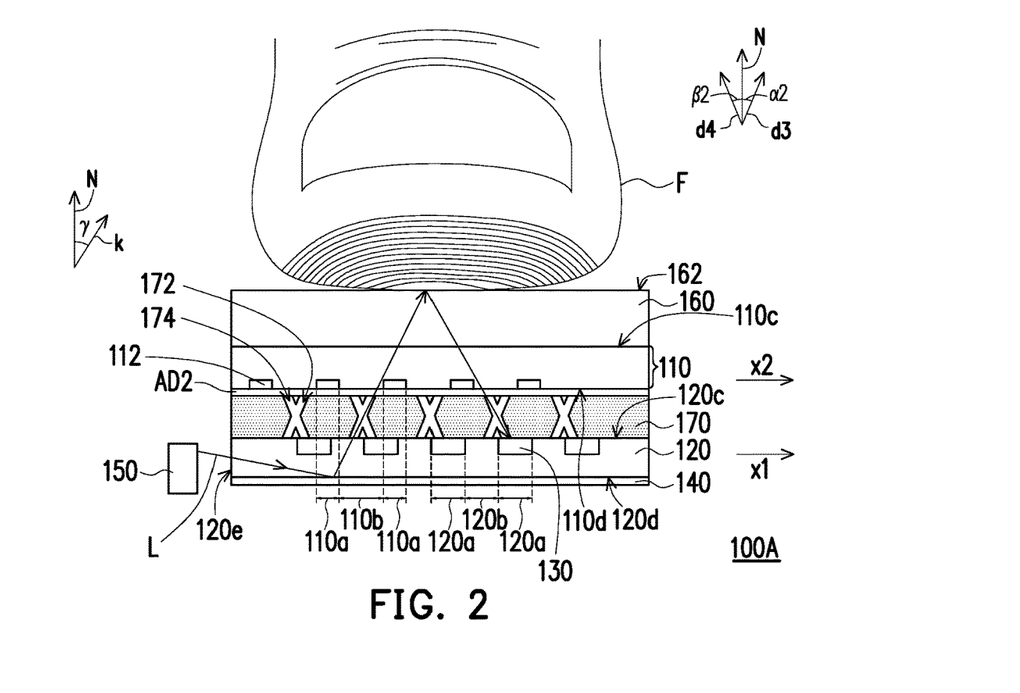
FIG. 2 is a cross section of a fingerprint identification apparatus of the second embodiment of the invention.

FIG. 2 is a cross section of a fingerprint identification apparatus of the second embodiment of the invention. Referring to FIG. 1 and FIG. 2, a fingerprint identification apparatus 100A of the second embodiment and the fingerprint identification apparatus 100 of the first embodiment are similar, and the difference between the two is that the fingerprint identification apparatus 100A of the second embodiment further includes a collimating device 170. The difference between the fingerprint identification apparatus 100A and the fingerprint identification apparatus 100 is mainly described below, and the same or similar portions of the two are as provided above.

Referring to FIG. 2, the fingerprint identification apparatus 100A further includes a collimating device 170. The collimating device 170 is disposed between the display device 110 and the plurality of photosensitive structures 130. The collimating device 170 has a plurality of first optical channels 172 extended along a third oblique direction d3 and a plurality of second optical channels 174 extended along a fourth oblique direction d4. One light-emitting region 120b of the first translucent base 120 and one transmissive region 110b of the display device 110 corresponding to each other are respectively disposed adjacent to two ends of each of the first optical channels 172. One transmissive region 110b of the display device 110 and one photosensitive structure 130 corresponding to each other are respectively disposed adjacent to two ends of each of the second optical channels 174.

In the present embodiment, an angle $\alpha 2$ is between the third oblique direction d3 and the normal direction N of the display surface 110c, and $0°<\alpha 2<90°$. An angle $\beta 2$ is between the fourth oblique direction d4 and the normal direction N of the display surface 110c, and $0°<\beta 2<90°$. The angle $\alpha 2$ and the angle $\beta 2$ can be the same or different.

In the present embodiment, the first optical channel 172 and the second optical channel 174 can be disposed across each other and connected to each other. However, the invention is not limited thereto, and in other embodiments, the first optical channel 172 and the second optical channel 174 can also be separated from each other and not connected to each other.

In the present embodiment, the light beam L entering the first translucent base 120 from the side surface 120e is, in order, guided by the first light-guide structure 140, passes through the light-emitting region 120b of the first translucent base 120, passes through the first optical channel 172 to be transmitted to the transmissive region 110b of the display device 110, passes through the cover plate 160, is diffused by the fingerprint F, passes through the cover plate 160 again, passes through another transmissive region 110b of the display device 110, and passes through the second optical channel 174 to be transmitted to the photosensitive structures 130. Accordingly, the photosensitive structures 130 can obtain an image of the fingerprint F for fingerprint identification. Via the first optical channel 172 and the second optical channel 174 of the collimating device 170, the fingerprint identification apparatus 100A can further alleviate the issue of cross talk.

Figure 3:
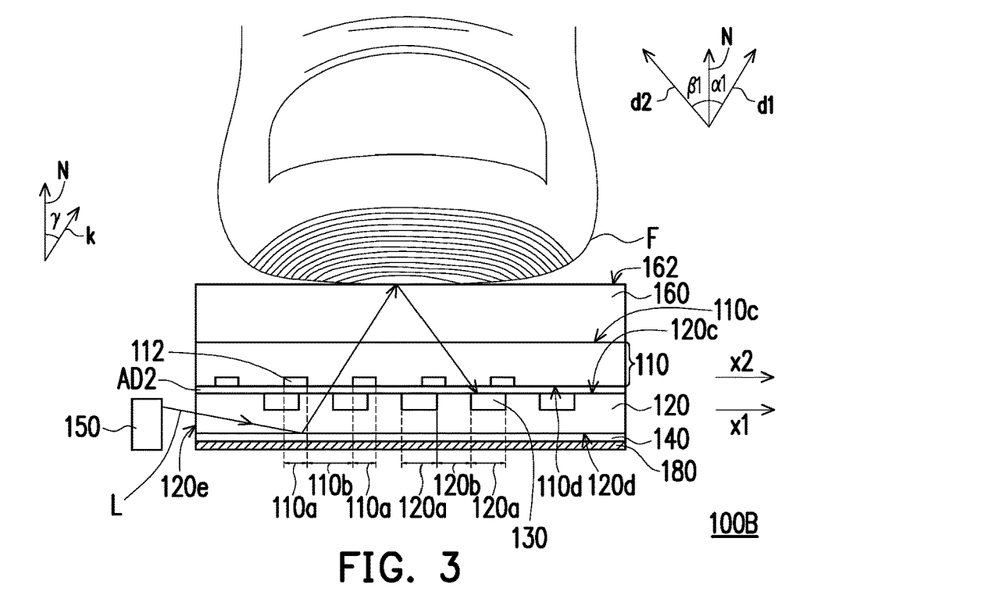
FIG. 3 is a cross section of a fingerprint identification apparatus of the third embodiment of the invention.

FIG. 3 is a cross section of a fingerprint identification apparatus of the third embodiment of the invention. Referring to FIG. 1 and FIG. 3, a fingerprint identification apparatus 100B of the third embodiment and the fingerprint identification apparatus 100 of the first embodiment are similar, and the difference between the two is that the fingerprint identification apparatus 100B of the third embodiment further includes a reflective layer 180. The difference between the fingerprint identification apparatus 100B and the fingerprint identification apparatus 100 is mainly described below, and the same or similar portions of the two are as provided above. Referring to FIG. 3, the fingerprint identification apparatus 100B further includes a reflective layer 180. The first light-guide structure 140 is disposed between the plurality of photosensitive structures 130 and the reflective layer 180. In the present embodiment, the first light-guide structure 140 is disposed between the first translucent base 120 and the reflective layer 180. Via the disposition of the reflective layer 180, the intensity of the light beam L irradiated to the fingerprint F can be increased to increase the image-capture quality of the fingerprint identification apparatus 100B.

Figure 4:
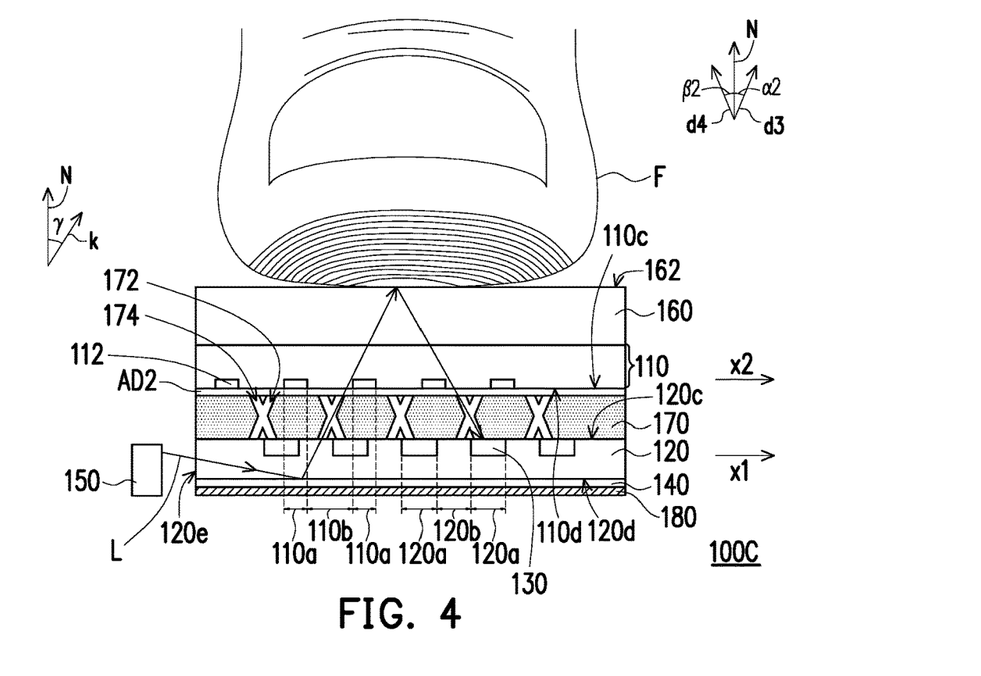
FIG. 4 is a cross section of a fingerprint identification apparatus of the fourth embodiment of the invention.

FIG. 4 is a cross section of a fingerprint identification apparatus of the fourth embodiment of the invention. Referring to FIG. 2 and FIG. 4, a fingerprint identification apparatus 100C of the fourth embodiment and the fingerprint identification apparatus 100A of the second embodiment are similar, and the difference between the two is that the fingerprint identification apparatus 100C of the fourth embodiment further includes a reflective layer 180. The difference between the fingerprint identification apparatus 100C and the fingerprint identification apparatus 100A is mainly described below, and the same or similar portions of the two are as provided above. Referring to FIG. 4, the fingerprint identification apparatus 100C further includes a reflective layer 180. The first light-guide structure 140 is disposed between the plurality of photosensitive structures 130 and the reflective layer 180. In the present embodiment, the first light-guide structure 140 is disposed between the first translucent base 120 and the reflective layer 180. Via the disposition of the reflective layer 180, the amount of the light beam L irradiated to the fingerprint F can be increased to increase the image-capture quality of the fingerprint identification apparatus 100C.

Figure 5:
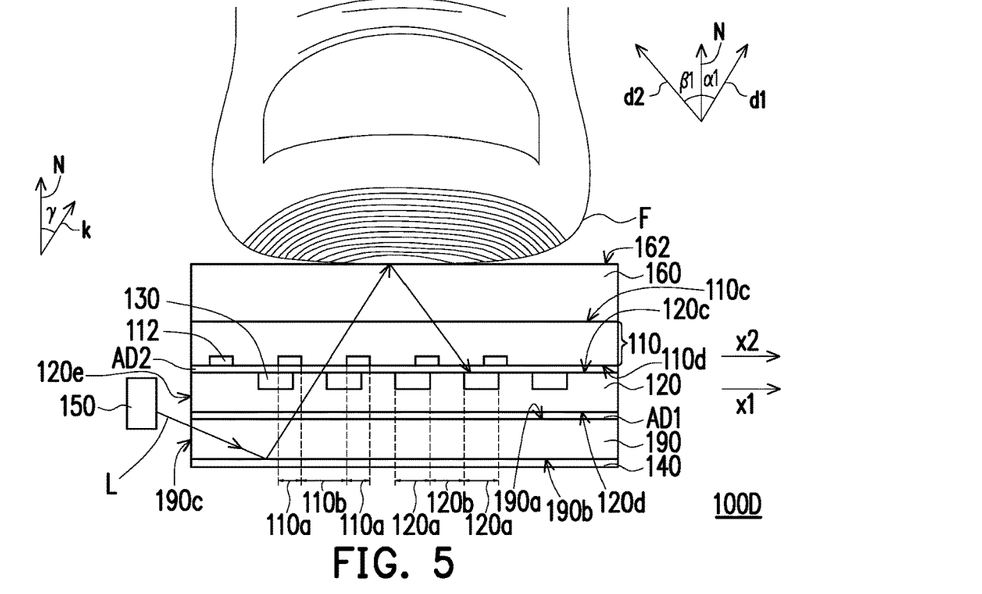
FIG. 5 is a cross section of a fingerprint identification apparatus of the fifth embodiment of the invention.

FIG. 5 is a cross section of a fingerprint identification apparatus of the fifth embodiment of the invention. A fingerprint identification apparatus 100D of the fifth embodiment and the fingerprint identification apparatus 100 of the first embodiment are similar, and the difference between the two is that the fingerprint identification apparatus 100D of the fifth embodiment further includes a second translucent base 190 and a first adhesive layer AD1. The difference between the fingerprint identification apparatus 100D and the fingerprint identification apparatus 100 is mainly described below, and the same or similar portions of the two are as provided above.

Referring to FIG. 5, the fingerprint identification apparatus 100D further includes a second translucent base 190. The second translucent base 190 has a first surface 190a, a second surface 190b opposite to the first surface 190a, and a side surface 190c connected between the first surface 190a and the second surface 190b. The fingerprint identification apparatus 100D further includes a first adhesive layer AD1. The first adhesive layer AD1 is connected between the first translucent base 120 and the first surface 190a of the second translucent base 190 to adhere the first translucent base 120 to the first surface 190a of the second translucent base 190. The first light-guide structure 140 is disposed on the second surface 190b of the second translucent base 190. In the present embodiment, the second adhesive layer AD2 is, for instance, an optical adhesive, but the invention is not limited thereto.

In the present embodiment, the light beam L enters the second translucent base 120 from the side surface 190c of the second translucent base 190. Next, the light beam L is, in order, transmitted to the first light-guide structure 140, guided by the first light-guide structure 140, and passes through the second translucent base 190 to be transmitted from the light-emitting region 120b of the first translucent base 120 toward the transmissive region 110b of the display device 110. Next, the light beam L passes through the transmissive region 110b of the display device 110, passes through the cover plate 160, is diffused by the fingerprint F, passes through the cover plate 160 again, and passes through another transmissive region 110b of the display device 110 to be transmitted to the photosensitive structures 130. Accordingly, the photosensitive structures 130 can obtain an image of the fingerprint F for fingerprint identification. It should be mentioned that, via the light guide effect of the second translucent base 190, the intensity of the light beam L transmitted to each of the light-emitting regions 120b of the first translucent base 120 can be more consistent such that the intensity of the light beam L irradiated throughout the fingerprint F is more consistent to increase the image-capture quality of the fingerprint identification apparatus 100D.

Figure 6:
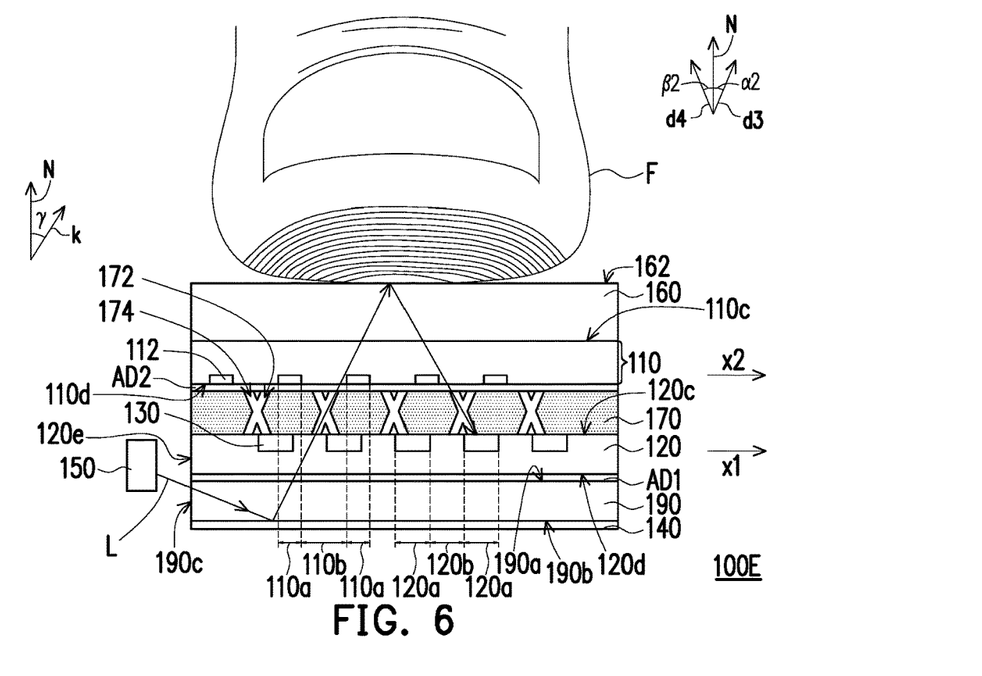
FIG. 6 is a cross section of a fingerprint identification apparatus of the sixth embodiment of the invention.

FIG. 6 is a cross section of a fingerprint identification apparatus of the sixth embodiment of the invention. Referring to FIG. 5 and FIG. 6, a fingerprint identification apparatus 100E of the sixth embodiment and the fingerprint identification apparatus 100D of the fifth embodiment are similar, and the difference between the two is that the fingerprint identification apparatus 100E of the sixth embodiment further includes a collimating device 170. The structure of the collimating device 170 and the relative positions of the collimating device 170 and other components are as provided in FIG. 6 and the above and are therefore not repeated herein.

Figure 7:
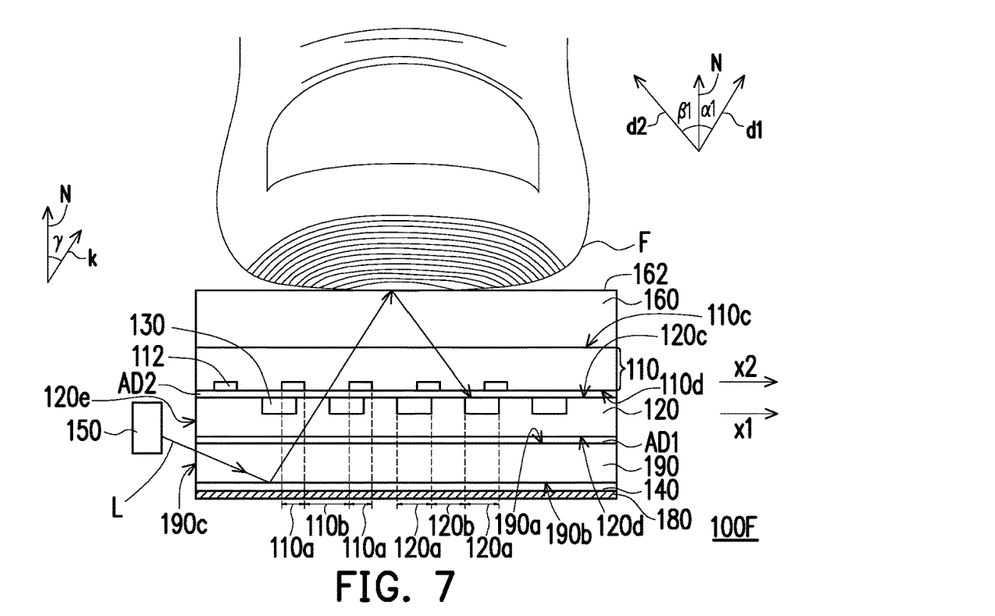
FIG. 7 is a cross section of a fingerprint identification apparatus of the seventh embodiment of the invention.

FIG. 7 is a cross section of a fingerprint identification apparatus of the seventh embodiment of the invention. Referring to FIG. 5 and FIG. 7, a fingerprint identification apparatus 100F of the seventh embodiment and the fingerprint identification apparatus 100D of the fifth embodiment are similar, and the difference between the two is that the fingerprint identification apparatus 100F of the seventh embodiment further includes a reflective layer 180. The first light-guide structure 140 is disposed between the second surface 190b of the second translucent base 190 and the reflective layer 180. The same or similar portions of the fingerprint identification apparatus 100F and the fingerprint identification apparatus 100D are as provided above and are therefore not repeated herein.

Figure 8:
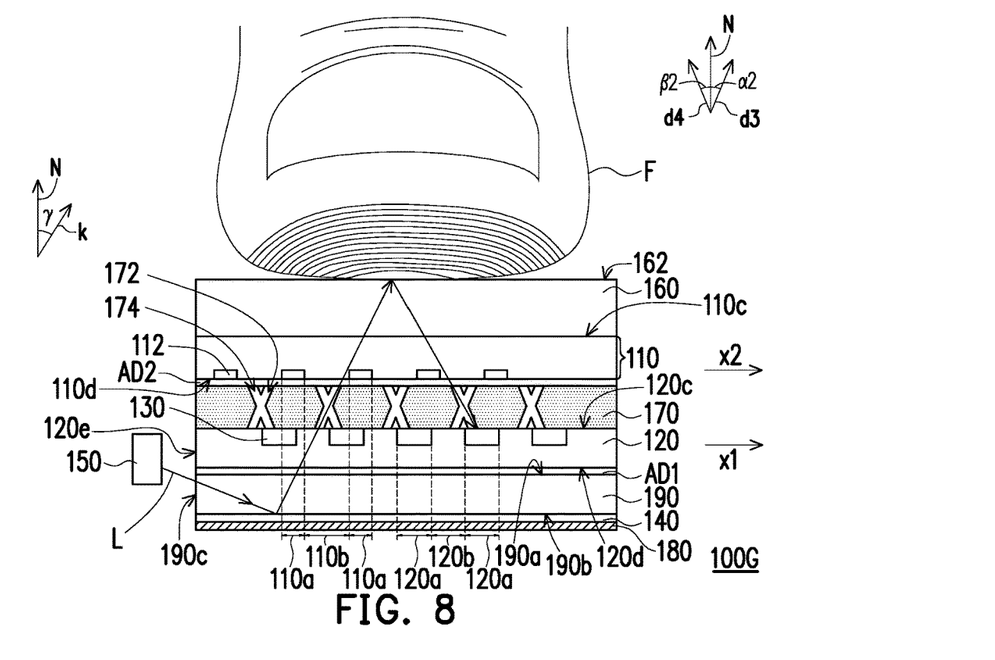
FIG. 8 is a cross section of a fingerprint identification apparatus of the eighth embodiment of the invention.

FIG. 8 is a cross section of a fingerprint identification apparatus of the eighth embodiment of the invention. Referring to FIG. 7 and FIG. 8, a fingerprint identification apparatus 100G of the eighth embodiment and the fingerprint identification apparatus 100F of the seventh embodiment are similar, and the difference between the two is that the fingerprint identification apparatus 100G of the eighth embodiment further includes a collimating device 170. The structure of the collimating device 170 and the relative positions of the collimating device 170 and other components are as provided in FIG. 8 and the above and are therefore not repeated herein.

Figure 9:
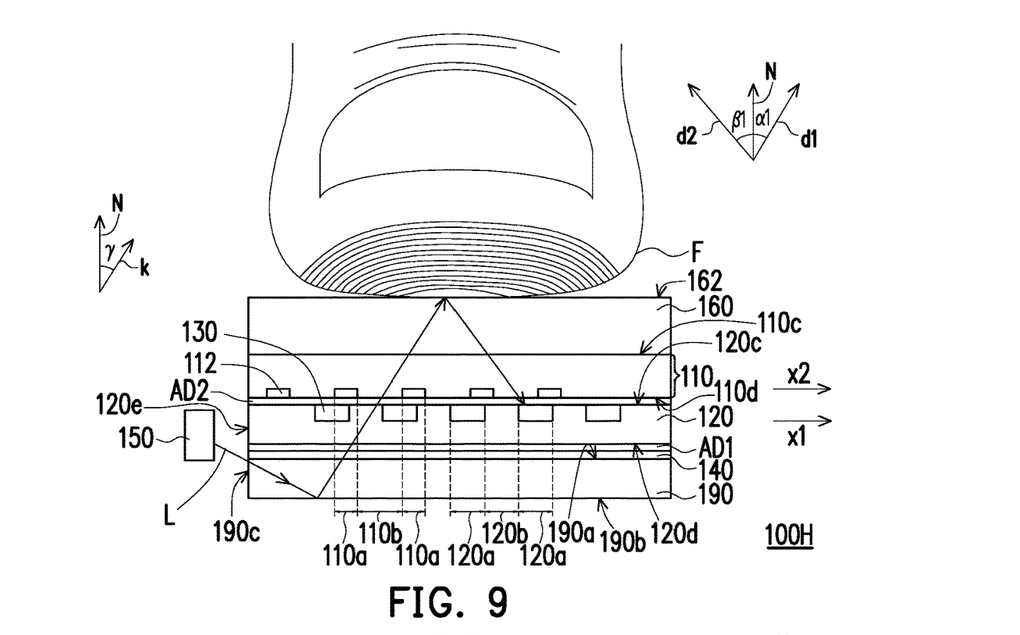
FIG. 9 is a cross section of a fingerprint identification apparatus of the ninth embodiment of the invention.

FIG. 9 is a cross section of a fingerprint identification apparatus of the ninth embodiment of the invention. Referring to FIG. 5 and FIG. 9, a fingerprint identification apparatus 100H of the ninth embodiment and the fingerprint identification apparatus 100D of the fifth embodiment are similar, and the difference between the two is that the location of the first light-guide structure 140 of the fingerprint identification apparatus 100H and the location of the first light-guide structure 140 of the fingerprint identification apparatus 100D are different. Referring to FIG. 9, in the present embodiment, the first light-guide structure 140 is disposed on the first surface 190a of the second translucent base 190. The same or similar portions of the fingerprint identification apparatus 100H and the fingerprint identification apparatus 100D are as provided above and are therefore not repeated herein.

Figure 10:
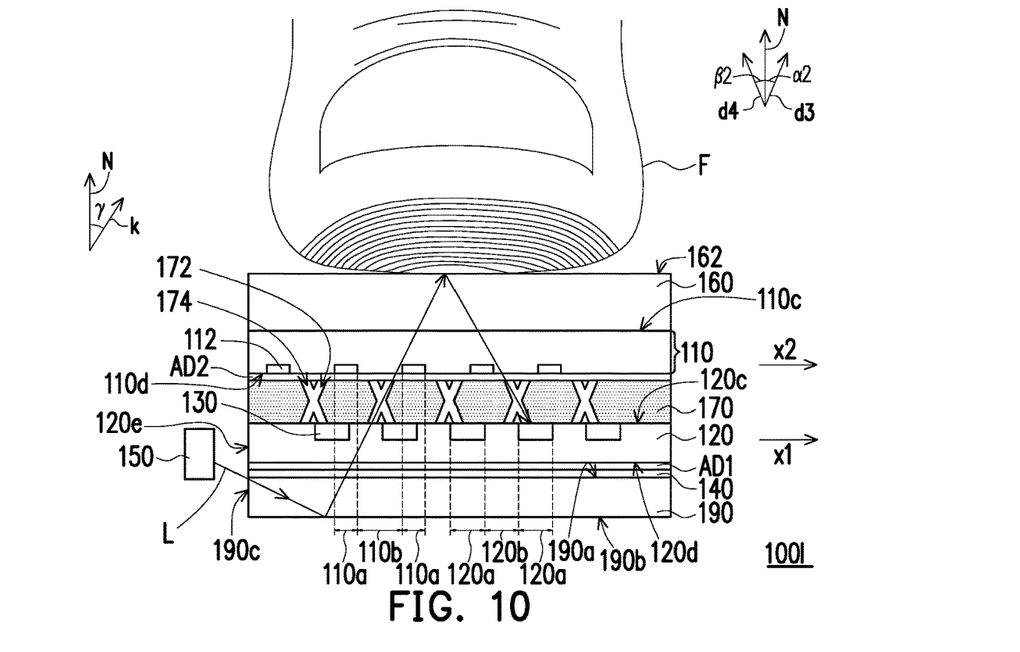
FIG. 10 is a cross section of a fingerprint identification apparatus of the tenth embodiment of the invention.

FIG. 10 is a cross section of a fingerprint identification apparatus of the tenth embodiment of the invention. Referring to FIG. 9 and FIG. 10, a fingerprint identification apparatus 100I of the tenth embodiment and the fingerprint identification apparatus 100H of the ninth embodiment are similar, and the difference between the two is that the fingerprint identification apparatus 100I of the tenth embodiment further includes a collimating device 170. The structure and effects of the collimating device 170 and the relative positions of the collimating device 170 and other components are as provided in FIG. 10 and the above and are therefore not repeated herein.

Figure 11:
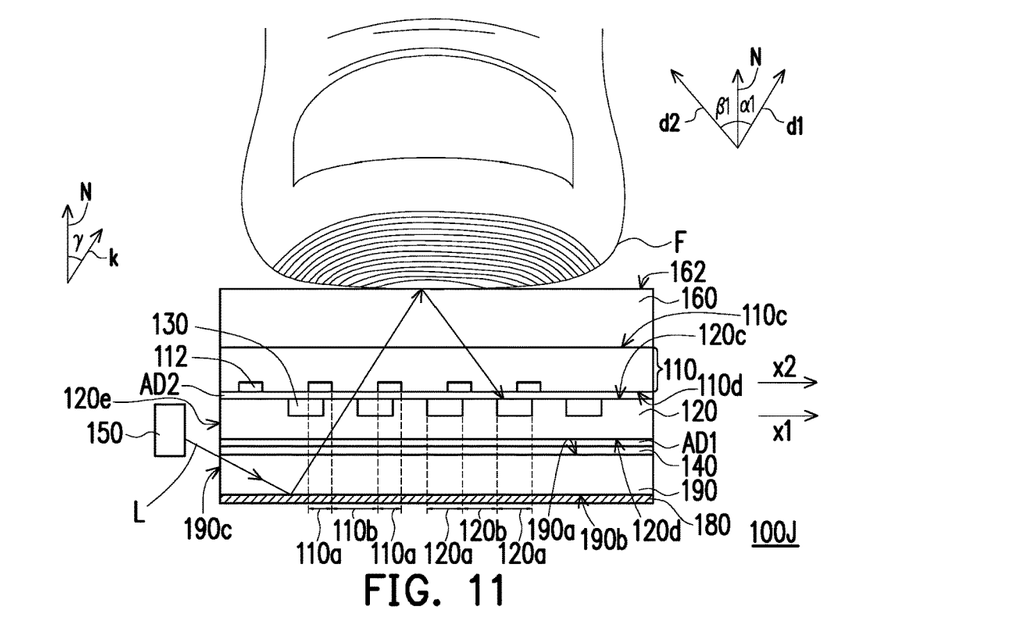
FIG. 11 is a cross section of a fingerprint identification apparatus of the eleventh embodiment of the invention.

FIG. 11 is a cross section of a fingerprint identification apparatus of the eleventh embodiment of the invention. Referring to FIG. 9 and FIG. 11, a fingerprint identification apparatus 100J of the tenth embodiment and the fingerprint identification apparatus 100H of the ninth embodiment are similar, and the difference between the two is that the fingerprint identification apparatus 100J of the eleventh embodiment further includes a reflective layer 180. Referring to FIG. 11, in the present embodiment, the reflective layer 180 is disposed on the second surface 190b of the second translucent base 190. The same or similar portions of the fingerprint identification apparatus 100J and the fingerprint identification apparatus 100H are as provided above and are therefore not repeated herein.

Figure 12:
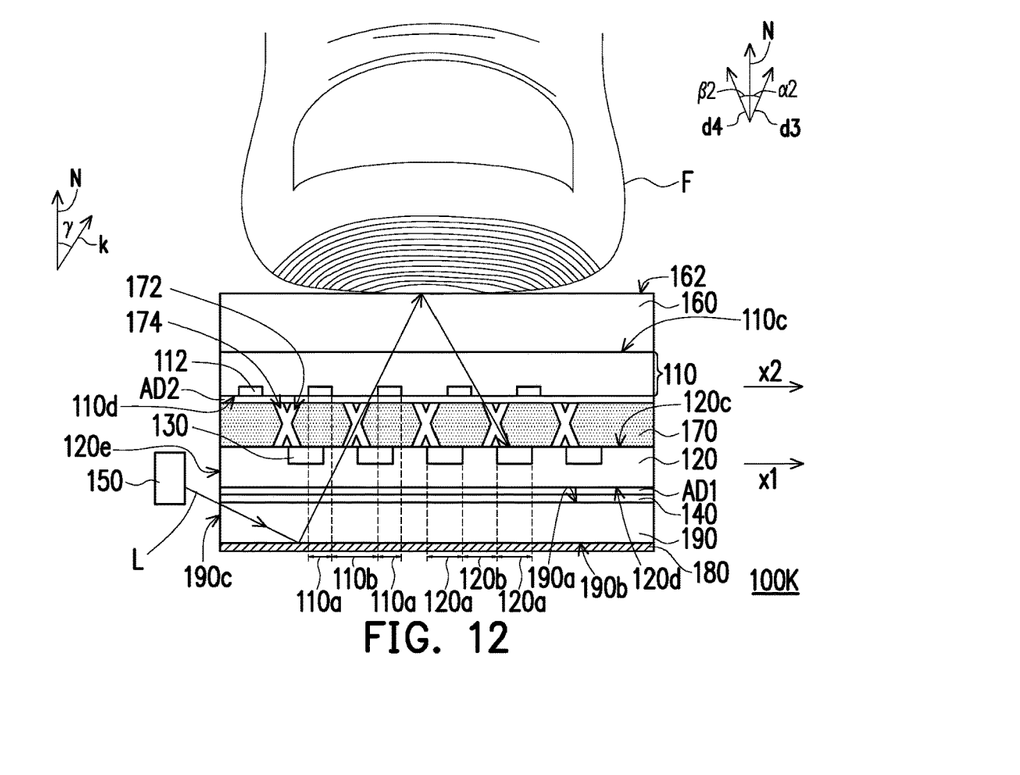
FIG. 12 is a cross section of a fingerprint identification apparatus of the twelfth embodiment of the invention.

FIG. 12 is a cross section of a fingerprint identification apparatus of the twelfth embodiment of the invention. Referring to FIG. 11 and FIG. 12, a fingerprint identification apparatus 100K of the twelfth embodiment and the fingerprint identification apparatus 100J of the eleventh embodiment are similar, and the difference between the two is that the fingerprint identification apparatus 100K of the second embodiment further includes a collimating device 170. The structure and effects of the collimating device 170 and the relative positions of the collimating device 170 and other components are as provided in the above and are therefore not repeated herein.

Figure 13:
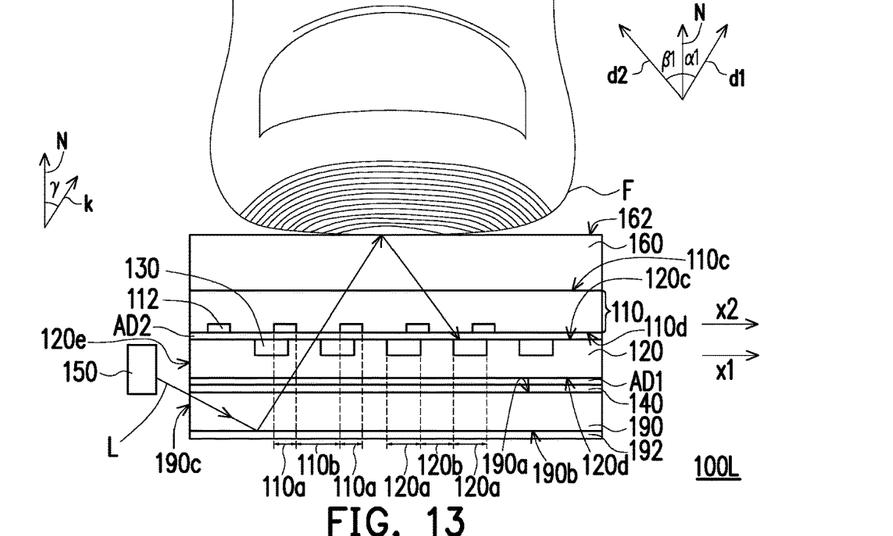
FIG. 13 is a cross section of a fingerprint identification apparatus of the thirteenth embodiment of the invention.

FIG. 13 is a cross section of a fingerprint identification apparatus of the thirteenth embodiment of the invention. Referring to FIG. 9 and FIG. 13, a fingerprint identification apparatus 100L of the thirteenth embodiment and the fingerprint identification apparatus 100H of the ninth embodiment are similar, and the difference between the two is that the fingerprint identification apparatus 100L further includes a second light-guide structure 192 disposed on the second surface 190b of the second translucent base 190. The same or similar portions of the fingerprint identification apparatus 100L and the fingerprint identification apparatus 100H are as provided above and are therefore not repeated herein.

Figure 14:
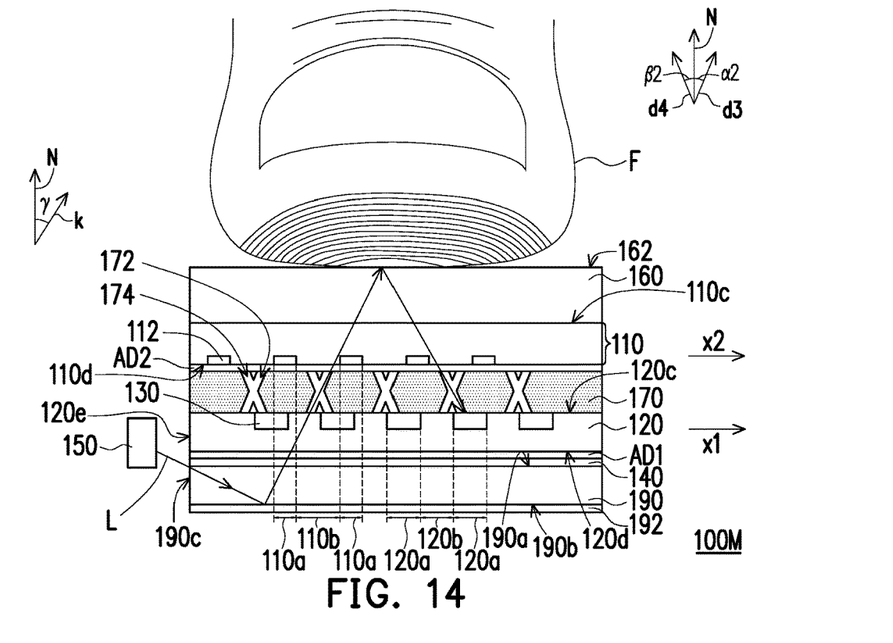
FIG. 14 is a cross section of a fingerprint identification apparatus of the fourteenth embodiment of the invention.

FIG. 14 is a cross section of a fingerprint identification apparatus of the fourteenth embodiment of the invention. Referring to FIG. 13 and FIG. 14, a fingerprint identification apparatus 100M of the fourteenth embodiment and the fingerprint identification apparatus 100L of the thirteenth embodiment are similar, and the difference between the two is that the fingerprint identification apparatus 100M of the fourteenth embodiment further includes a collimating device 170. The structure and effects of the collimating device 170 and the relative positions of the collimating device 170 and other components are as provided in FIG. 14 and the above and are therefore not repeated herein.

Figure 15:
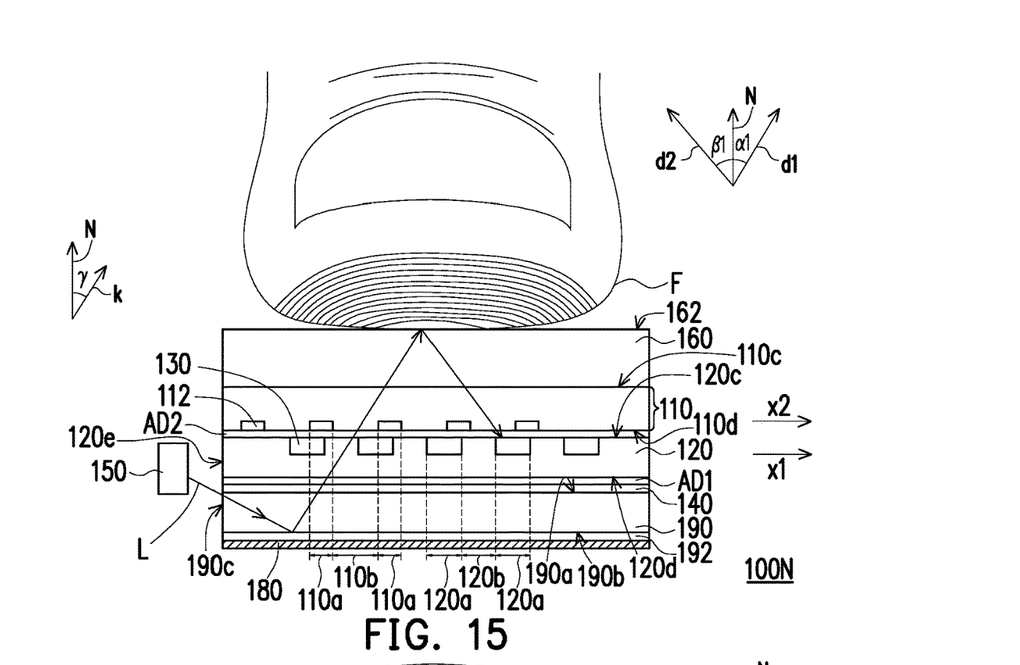
FIG. 15 is a cross section of a fingerprint identification apparatus of the fifteenth embodiment of the invention.

FIG. 15 is a cross section of a fingerprint identification apparatus of the fifteenth embodiment of the invention. Referring to FIG. 13 and FIG. 15, a fingerprint identification apparatus 100N of the fifteenth embodiment and the fingerprint identification apparatus 100L of the thirteenth embodiment are similar, and the difference between the two is that the fingerprint identification apparatus 100N of the fifteenth embodiment further includes a reflective layer 180. Referring to FIG. 15, in the present embodiment, the reflective layer 180 is disposed on the second surface 190b of the second translucent base 190, and the second light-guide structure 192 is disposed between the second translucent base 190 and the reflective layer 180.

Figure 16:
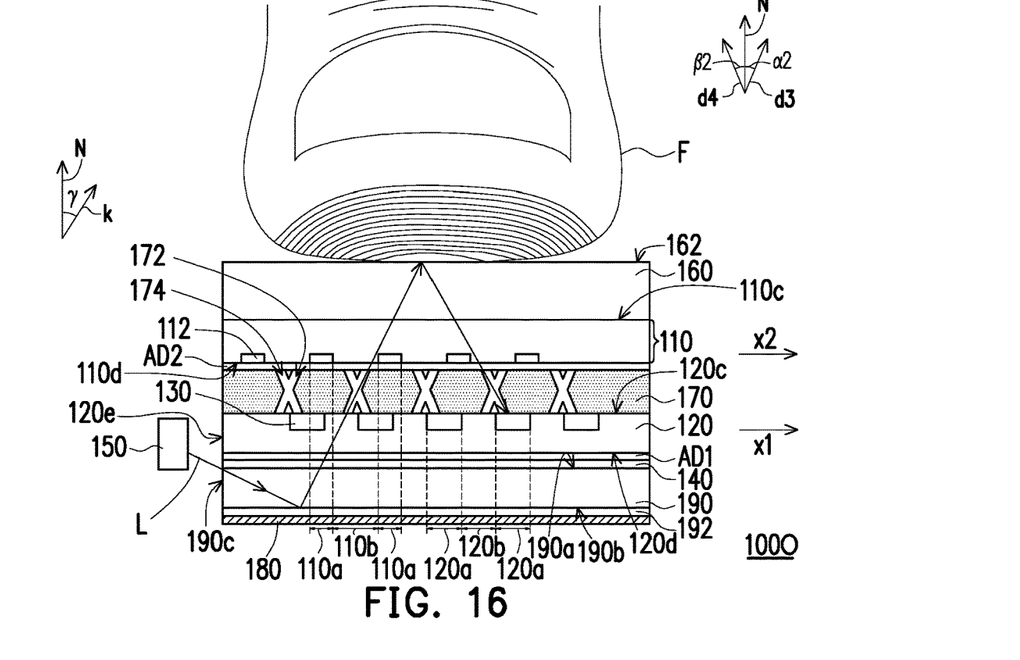
FIG. 16 is a cross section of a fingerprint identification apparatus of the sixteenth embodiment of the invention.

FIG. 16 is a cross section of a fingerprint identification apparatus of the sixteenth embodiment of the invention. Referring to FIG. 15 and FIG. 16, a fingerprint identification apparatus 100O of the sixteenth embodiment and the fingerprint identification apparatus 100N of the fifteenth embodiment are similar, and the difference between the two is that the fingerprint identification apparatus 100N of the sixteenth embodiment further includes a collimating device 170. The structure and effects of the collimating device 170 and the relative positions of the collimating device 170 and other components are as provided in FIG. 16 and the above and are therefore not repeated herein.

Based on the above, in an embodiment of the invention, the separately manufactured photosensitive structures are disposed below the display device, and therefore a fingerprint identification apparatus having a full-sensing area can be implemented under the premise of not affecting the resolution of the display device. Moreover, the plurality of photosensitive structures and the first translucent base can be regarded as one photoelectronic sensor, the light beam irradiating the fingerprint is provided by a light source disposed adjacent to the photoelectronic sensor, and the light beam emitted by the light source is transmitted using the first translucent base of the photoelectronic sensor. Therefore, the fingerprint identification apparatus can perform fingerprint identification when the display device displays a black screen (i.e., no display).

Although the invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A fingerprint identification apparatus configured to sense a fingerprint, the fingerprint identification apparatus comprising:
    a display device having a plurality of pixel regions and a plurality of transmissive regions located between the pixel regions;
    a first translucent base having a plurality of photosensitive regions and a plurality of light-emitting regions located between the photosensitive regions;
    a plurality of photosensitive structures respectively disposed in the photosensitive regions of the first translucent base;
    a first light-guide structure, wherein the first translucent base is disposed between the photosensitive structures and the first light-guide structure; and
    a light source disposed adjacent to the first translucent base and configured to emit a light beam, wherein the light beam is, in order, guided by the first light-guide structure to be transmitted from one of the light-emitting regions of the first translucent base toward the display device, passes through one of the transmissive regions of the display device, is diffused by the fingerprint, and passes through another of the transmissive regions of the display device to be transmitted to one of the photosensitive structures.

2. The fingerprint identification apparatus of claim 1, wherein the display device has a display surface, each of the light-emitting regions of the first translucent base and a corresponding transmissive region of the display device are arranged along a first oblique direction, an angle $\alpha 1$ is between the first oblique direction and a normal direction of the display surface, and $0°<\alpha 1<90°$.

3. The fingerprint identification apparatus of claim 1, wherein the display device has a display surface, each of the transmissive regions of the display device and a corresponding photosensitive structure are arranged along a second oblique direction, an angle $\beta 1$ is between the second oblique direction and a normal direction of the display surface, and $0<\beta 1<90°$.

4. The fingerprint identification apparatus of claim 1, wherein the display device has a display surface, each of the light-emitting regions of the first translucent base and a corresponding transmissive region of the display device are arranged along a first oblique direction, each of the transmissive regions of the display device and a corresponding photosensitive structure are arranged along a second oblique direction, and the first oblique direction is intersected with the second oblique direction.

5. The fingerprint identification apparatus of claim 1, further comprising:
    a collimating device disposed between the display device and the photosensitive structures, wherein the collimating device has a plurality of first optical channels extended along a third oblique direction and a plurality of second optical channels extended along a fourth oblique direction, the third oblique direction is intersected with the fourth oblique direction, one of the light-emitting regions of the first translucent base and one of the transmissive regions of the display device corresponding to each other are respectively disposed adjacent to two ends of each of the first optical channels, and one of the transmissive regions of the display device and one of the photosensitive structures corresponding to each other are respectively disposed adjacent to two ends of each of the second optical channels.

6. The fingerprint identification apparatus of claim 1, wherein the first translucent base has a first surface and a second surface opposite to each other, the photosensitive structures are disposed on the first surface of the first translucent base, and the first light-guide structure is disposed on the second surface of the first translucent base.

7. The fingerprint identification apparatus of claim 1, further comprising:
a reflective layer, wherein the first light-guide structure is disposed between the photosensitive structures and the reflective layer.

8. The fingerprint identification apparatus of claim 1, further comprising:
a second translucent base having a first surface, a second surface opposite to the first surface, and a side surface connected to the first surface and the second surface, wherein the light beam enters the second translucent base from the side surface of the second translucent base, and the first translucent base is disposed on the first surface of the second translucent base.

9. The fingerprint identification apparatus of claim 8, further comprising:
a first adhesive layer connected between the first translucent base and the first surface of the second translucent base.

10. The fingerprint identification apparatus of claim 8, wherein the first light-guide structure is disposed on the second surface of the second translucent base.

11. The fingerprint identification apparatus of claim 10, further comprising:
a reflective layer, wherein the first light-guide structure is disposed between the second surface of the second translucent base and the reflective layer.

12. The fingerprint identification apparatus of claim 8, wherein the first light-guide structure is disposed on the first surface of the second translucent base.

13. The fingerprint identification apparatus of claim 12, further comprising:
a reflective layer disposed on the second surface of the second translucent base.

14. The fingerprint identification apparatus of claim 8, further comprising:
a second light-guide structure, wherein the first light-guide structure and the second light-guide structure are disposed on the first surface of the second translucent base and the second surface of the second translucent base.

15. The fingerprint identification apparatus of claim 14, further comprising:
a reflective layer disposed on the second surface of the second translucent base, wherein the second light-guide structure is disposed between the second translucent base and the reflective layer.

16. The fingerprint identification apparatus of claim 1, further comprising:
a second adhesive layer connected between the display device and the first translucent base.

17. The fingerprint identification apparatus of claim 1, wherein an angle $\gamma$ is between a transmission direction of the light beam guided by the first light-guide structure and not passing through the display device and a normal direction of the display surface, and $30°\leq\gamma\leq85°$.

* * * * *